US007001832B2

(12) United States Patent
Neyret

(10) Patent No.: US 7,001,832 B2
(45) Date of Patent: Feb. 21, 2006

(54) METHOD FOR LIMITING SLIP LINES IN A SEMICONDUCTOR SUBSTRATE

(75) Inventor: Eric Neyret, Sassenage (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 24 days.

(21) Appl. No.: 10/840,610

(22) Filed: May 5, 2004

(65) Prior Publication Data

US 2005/0202658 A1    Sep. 15, 2005

(30) Foreign Application Priority Data

Mar. 10, 2004  (FR) .................................. 04 02475

(51) Int. Cl.
*H01L 21/425* (2006.01)

(52) U.S. Cl. ...................... 438/517; 438/530; 438/550

(58) Field of Classification Search ............... 438/517, 438/518, 522, 530, 550
See application file for complete search history.

(56) References Cited

U.S. PATENT DOCUMENTS

| 4,958,061 | A | 9/1990 | Wakabayashi et al. ....... 219/411 |
| 5,985,678 | A | 11/1999 | Kiyama .......................... 438/5 |
| 6,127,288 | A | 10/2000 | Kiyama ...................... 438/795 |
| 6,184,498 | B1 | 2/2001 | Kiyama ...................... 219/390 |
| 6,235,543 | B1 | 5/2001 | Kiyama ......................... 438/5 |
| 6,274,439 | B1 | 8/2001 | Ito ............................ 438/278 |
| 6,544,656 | B1 * | 4/2003 | Abe et al. ................... 428/446 |
| 2004/0171257 | A1 | 9/2004 | Neyret et al. ............... 438/689 |

FOREIGN PATENT DOCUMENTS

| JP | 04168764 | 6/1992 |
| JP | 8236737 | 11/1992 |
| WO | WO 01/15215 | 3/2001 |

* cited by examiner

*Primary Examiner*—Phuc T. Dang
(74) *Attorney, Agent, or Firm*—Winston & Strawn LLP

(57) ABSTRACT

A method for limiting slip lines in a semiconductor substrate including a support layer and a useful semiconductor layer that is transferred to the support layer. The method includes precipitating at least a portion of interstitial oxygen in the support layer by a series of heat treatments conducted after bonding of the useful semiconductor layer to the support layer. The heat treatments occur at a temperature and a time sufficient to reduce the generation of slip lines therein.

15 Claims, 3 Drawing Sheets

| 3 | 3 | 1 |
|---|---|---|
| 4 | 3 | 1 |
| 3 | 6 | 2 |
| 5 | 6 | 2 |
| 5 | 1 | 5 |
| 3 | 1 | 5 |
| 3 | 7 | 7 |

FIG.3

METHOD FOR LIMITING SLIP LINES IN A SEMICONDUCTOR SUBSTRATE

BACKGROUND ART

The present invention generally relates to the production of composite substrates based on silicon, such as silicon on insulator (SOI) type substrates.

It is known to fabricate a substrate by transferring a thin semiconductor layer onto a base substrate acting as a massive support that initially has a non-zero quantity of interstitial oxygen. For example, such a method is used to produce support substrates having high resistivity. To achieve this end, the interstitial oxygen present in the base substrate is precipitated to reduce the quantity of residual oxygen. i.e. the oxygen remaining after precipitation). Studies in this area have shown that a high resistivity substrate may be obtained by achieving a residual oxygen content Oi which is as low as possible. Such substrates may be used in the field of microwave applications. In particular, integrating high quality factor, passive components implies limiting high frequency losses by eddy currents, which can be achieved by endowing the base substrate with high resistivity of typically more than 100 ohms ($\Omega$).

A further justification for using this type of method is linked to the fabrication of substrates that are capable of withstanding severe heat treatments without developing slip lines. Such heat treatments are, for example, integrated into substrate finishing treatment phases.

It is known (see, for example, International patent application WO-A-01 15215) that by using a rapid thermal annealing (RTA) step in a reducing atmosphere before implementing a chemical-mechanical polishing step, it is possible to improve the quality of a thin layer more effectively than with simple polishing or simple annealing. Such operation also avoids to a great extent the undesirable effects of simple chemical-mechanical polishing. RTA type annealing in a reducing atmosphere actually commences the smoothing of the surface of the thin layer. The polishing time necessary to obtain a satisfactory roughness value is thus reduced or even avoided, thus increasing production capacity and also limiting the negative effects of polishing, in particular as regards uniformity in the thickness of the thin layer.

However, heat treatments, and in particular rapid thermal annealing (RTA) treatments, include rapid temperature rises and very high temperatures (typically 1200° C. in less than one minute). Such finishing treatments are necessary for the production of an SOI substrate wafer but also tend to cause undesirable slip lines in the treated wafer. The slip lines, which are fracture planes that offset the crystalline structure of the wafer, affect the electrical performance of the components which are subsequently produced. Further, slip lines weaken the substrate and can lead to rupture of the structure during subsequent heat treatment(s) that are used to produce the components.

U.S. Pat. No. 6,544,656 describes a method of fabricating a high resistivity substrate and discloses using a series of specific heat treatments which are referred to herein as "HR HT" (for "High-Resistivity Heat Treatments"). These heat treatments can reduce the concentration of interstitial oxygen in the base substrate. U.S. Pat. No. 6,544,656 briefly recites that the method could limit the development of slip lines during subsequent component production. The oxygen content of a substrate may be measured in "new ppma", wherein ppma is an acronym for "parts per million atoms", and this measurement method is known to one skilled in the art.

A detailed study into the phenomena of the occurrence of slip lines in connection with the degree of precipitation of interstitial oxygen was conducted, but not in connection with obtaining a high resistivity base substrate. In contrast, U.S. Pat. No. 6,544,656 is directed to fabricating a high resistivity substrate, wherein the main goal is to control the final quantity of interstitial oxygen present in the base substrate, and slip line reduction phenomena was simply noted in certain cases.

SUMMARY OF THE INVENTION

The present invention relates to a method for limiting slip lines in a semiconductor substrate that includes a support layer and a useful semiconductor layer that is transferred to the support layer. The technique includes precipitating at least a portion of interstitial oxygen in the support layer by a series of heat treatments conducted after bonding of the useful semiconductor layer to the support layer, at a temperature and a time sufficient to reduce the generation of slip lines therein.

In an advantageous embodiment, the semiconductor substrate is fabricated by implanting species through a surface of a source substrate to form a zone of weakness, bonding the surface of the source substrate to a support layer having an initial quantity of interstitial oxygen, detaching the useful layer from the source substrate along the zone of weakness to form the semiconductor substrate, and finishing the semiconductor substrate. At least one of the heat treatments may advantageously occur during detachment of the useful layer from a source substrate, or during a thermal oxidation or deoxidation step that occurs during a finishing step of the semiconductor substrate, or during a heat treatment to strengthen a bonding interface between the useful layer and the support layer. In this manner the same equipment normally used for heat treatments during the fabrication process can be used to precipitate interstitial oxygen, any wafer adjustments are minimized, time is saved, and productivity is improved. The predetermined limit of slip lines may be expressed as the number of slip lines per unit surface area.

In a preferred embodiment, the initial concentration of interstitial oxygen in the support layer is in the range of about 12 to 14 new ppma. Such a concentration of interstitial oxygen is sufficient to guarantee that a minimum number of oxygen precipitates is formed after carrying out the intended heat treatment, but not as high as that required in a base substrate that is to have a high resistivity. The useful semiconductor layer may also be bonded to the support layer by molecular bonding.

In another preferred embodiment, the series of heat treatments for precipitating interstitial oxygen includes at least two heat treatments at different temperatures. A first heat treatment may be in a first temperature range and a second heat treatment may be in a second temperature range that is higher than the first range. The first heat treatment may advantageously occur during at least one of detachment of the useful layer, or during bonding of the source substrate to the support layer. In addition, the second heat treatment may beneficially occur during at least one of detachment of the useful layer, or during a thermal oxidation or deoxidation step during a finishing step of the semiconductor substrate, or during a heat treatment for strengthening the bonding interface, wherein the heat treatment for strengthening the bonding interface may be a thermal oxidation process. A third heat treatment in a third temperature range that is higher than the second temperature range may also be utilized, and the third heat treatment may be beneficially integrated into a heat treatment for strengthening the bonding interface. When the first, second and/or third heat treatments are integrated into treatments that normally occur during the substrate fabrication process, the same equipment can advantageously be used to conduct such heat treatments during normal processing to precipitate interstitial oxygen. In another implementation, the first, second or third heat treatments may be a complementary step.

In another implementation according to the invention, a substrate includes a useful semiconductor layer on a support layer. The support layer is a semiconductor material containing a controlled quantity of oxygen precipitates obtained from interstitial oxygen. The controlled quantity of oxygen precipitates is selected as a function of subsequent thermal conditions so that the support layer has a desired resistance to the generation of slip lines.

Advantageously, the support layer is a silicon substrate obtained by an ingot drawing method of at least one of a Czochralski (CZ) type or a Magnetic Field Applied Czochralski (MCZ) type. The initial concentration of interstitial oxygen in the support layer may beneficially be in the range from about 12 to 14 new ppma. Such a concentration of interstitial oxygen is sufficient to guarantee that a minimum number of oxygen precipitates is formed after carrying out the intended heat treatment. In an implementation, the useful layer is bonded to the support layer by molecular bonding, and the useful layer may be formed from monocrystalline silicon. The substrate may beneficially include an oxide layer between the support layer and the useful layer.

The present invention therefore exploits at least one of the heat treatment steps conducted after the thin layer has been transferred during the semiconductor substrate fabrication process to control the quantity of oxygen precipitates in the support layer. It should be noted that it is easier to intervene in the heat treatments occurring during the detachment or finishing steps of the fabrication method. Use of the present technique results in an improved substrate in terms of the appearance of slip lines that may occur during subsequent exposure to high temperatures, while maintaining an acceptable load on the general organization of an industrial fabrication method (the duration of the process, the number of manipulations, the number of steps, and the like).

The present invention thus provides a method for reducing slip lines in a controlled manner. It was recognized that controlling the quantity of oxygen which has precipitated in the base substrate is important, and the quantity of residual oxygen remaining after precipitation is of secondary importance. In fact, the concentration of residual oxygen remaining after precipitation can be higher than that indicated in the prior art.

BRIEF DESCRIPTION OF THE DRAWINGS

Other aspects, purposes and advantages of the invention will become clear after reading the following detailed description with reference to the attached drawings, in which:

FIG. 3 is a table illustrating a number of ways that heat treatments that exist in a traditional layer-transfer method can be used, in particular by integrating at least one heat treatment of a series of heat treatments for precipitating oxygen Oi into an existing heat treatment.

DETAILED DESCRIPTION OF THE PREFERRED EMBODIMENTS

Figure 1:
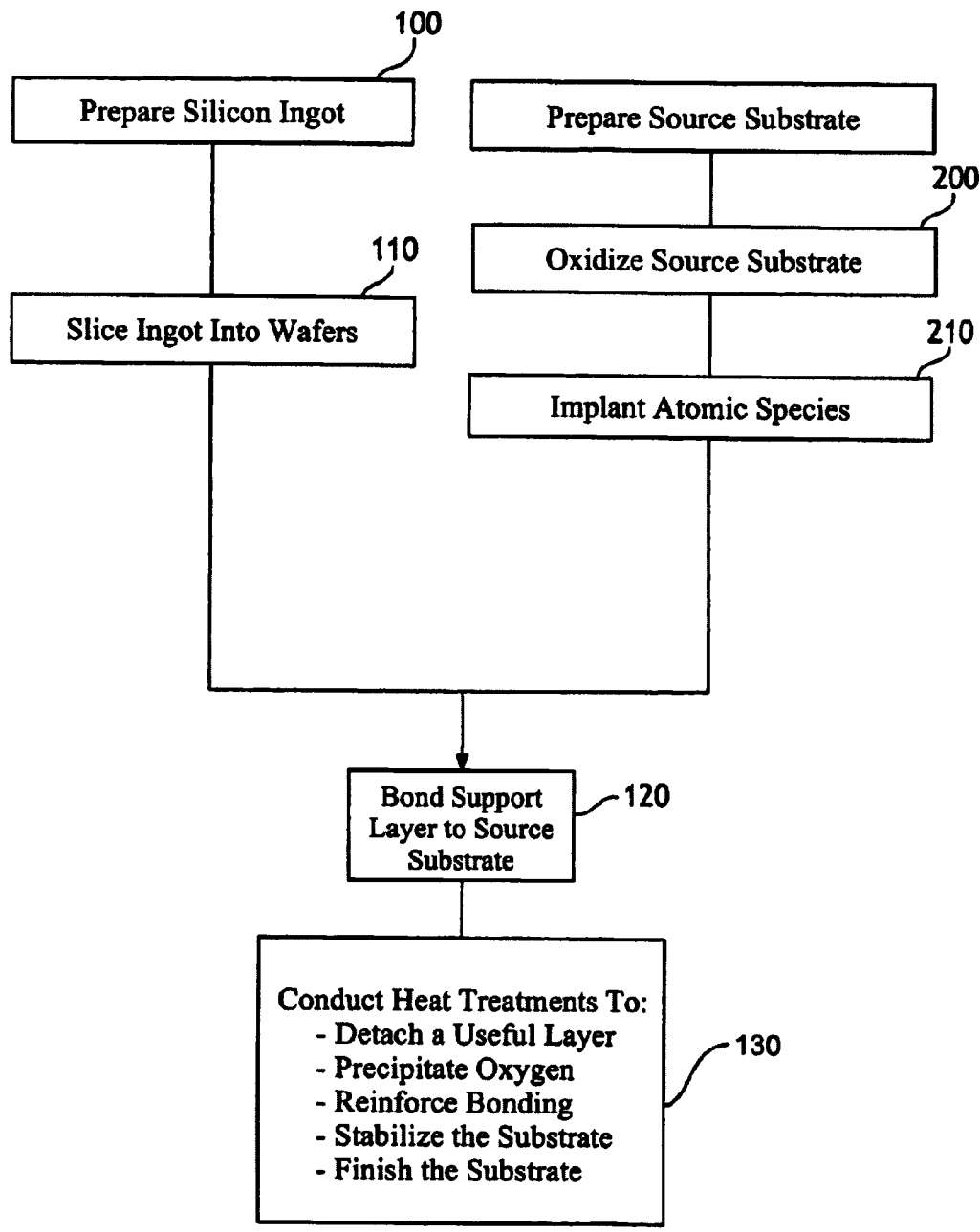
FIG. 1 is a diagram of the substrate fabricating steps in accordance with an implementation of the invention.
Figure 2:
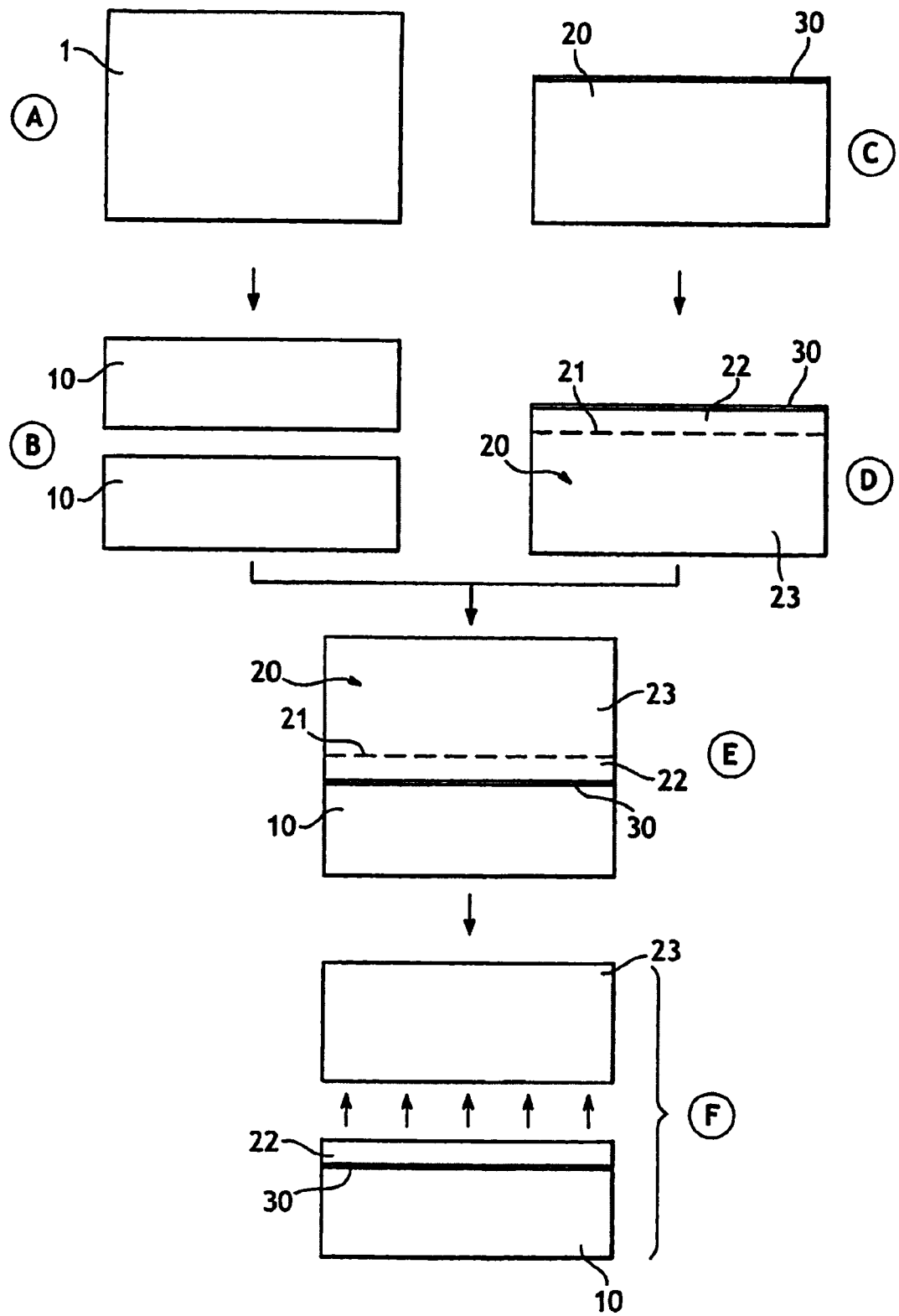
FIGS. 2A–2F are simplified, diagrammatic cross-sections of the different states of the material during implementation of the method of FIG. 1.

FIG. 1 is a diagram of the steps in a substrate fabrication method, and FIGS. 2A–2F are simplified block diagrams of the different states of the semiconductor material during implementation of the method. In FIG. 2A a Czochralski (CZ), Magnetic Field Applied Czochralski (MCZ), or like silicon ingot 1 is grown using a conventional technique (see also FIG. 1, step 100). The ingot pulling conditions are such that a certain concentration of interstitial oxygen exists in the material which is formed. In accordance with the present invention, the concentration of interstitial oxygen must be sufficient (of the order of 12 to 14 new ppma in a standard CZ substrate) to guarantee that a minimum concentration of oxygen precipitates is formed after carrying out the heat treatment.

The ingot 1 is sliced (step 110) by sawing it into wafers 10 (FIG. 2B) of a given thickness and then polished using techniques that are well known to the skilled person. FIG. 2B illustrates a first implementation of the method of the invention, wherein the base substrate 10 is prepared to form the support layer of a SOI substrate. It is noted that it is not useful for the concentration of interstitial oxygen initially present in the base substrate 10 to be as high as that which must be present in a base substrate that is to have a high resistivity (the value generally required to fabricate a high resistivity substrate being about 25 new ppma).

A source substrate 20 (FIG. 2C), typically of monocrystalline silicon, for forming a thin layer of final SOI substrate undergoes conventional surface thermal oxidation (FIG. 1, step 200) or has an oxide deposited thereon to form a layer of oxide 30. Next, a zone of weakness 21 (FIG. 2D) is created at a given depth beneath the oxide layer (not shown), preferably by species implantation (step 210). The zone of weakness defines a thin layer or useful layer 22 on the oxide side with respect to the remainder of the source substrate 20. Next, the base substrate 10 is molecularly bonded to the source substrate 20 at a bonding interface (FIG. 1, step 120 and FIG. 2E). A series of heat treatments is then performed (FIG. 1, step 130), wherein the heat treatments may use a plurality of constant temperature stages.

In the first implementation, three constant temperature stages are selected to simultaneously carry out detachment of the useful layer 22 from the remainder of the source substrate 20 at the zone of weakness 21, and to control precipitation of the interstitial oxygen Oi present in the base substrate 10 to obtain the desired quantity of oxygen precipitates. It should be noted that the heat treatments can also contribute, if necessary, to strengthening the bonding interface between the useful layer 22 and the support layer 10.

An example of the three constant temperature stages mentioned above is as follows. A first stage at about 650° C. lasts for about 2 hours, which simultaneously corresponds to a portion of the heat treatment used to detach the thin layer at the zone of weakness 21 and to a portion of the heat treatment used to precipitate interstitial oxygen Oi. A second stage occurs at about 800° C. and lasts for about 4 hours, and corresponds simultaneously to a thermal oxidation treatment used during a substrate finishing step and to a second portion of the heat treatment for precipitating residual oxygen Oi. More precisely, the thermal oxidation treatment is part of a sacrificial oxidation treatment that creates a protective layer to protect against attack linked to subsequent annealing steps. Finally, a third stage occurs at about 1000° C. and lasts for about 16 hours, and corresponds simultaneously to a heat treatment for strengthening the bonding interface and to the final portion of the heat treatment for precipitating residual oxygen Oi. It is noted that the series of heat treatments which precipitates at least a portion of the interstitial oxygen in the support layer is conducted after bonding of the useful semiconductor layer to the support layer, and is conducted at a temperature and a time sufficient to reduce the generation of slip lines therein.

FIG. 2F illustrates the situation after complete separation has occurred along the zone of weakness 21. The desired SOI substrate is obtained with the support layer 10 having a high resistance to the formation of slip lines, a useful semiconductor layer 22, and an oxide 30 produced on the useful layer and located at the bonding interface. The oxide forms an insulating layer 30 of the structure. It should be noted that the heat treatment for strengthening the bonding interface is different from that normally used, which typically consists of a 2 hour annealing step at 1100° C. for guaranteeing good bonding quality. In the present implementation, the heat treatment for strengthening the bonding interface is adapted to the characteristics of the third stage of heat treatment for precipitating residual oxygen Oi.

Advantageously, this implementation is further improved if the standard heat treatment is preceded by a standard oxidation treatment defined by a heat treatment at 950° C. for about 1 hour. In this case, the succession of oxidation and standard annealing steps is respectively adapted to the last two stages of the heat treatment for precipitating residual oxygen Oi. Proceeding in such manner, it has been found that each of the adaptations can produce a result in terms of quality that is equivalent to the corresponding standard treatments. It also has been found that such an implementation reduces the disadvantages linked to thermal stresses in standard treatments to a certain extent. For example, the oxidation step is carried out at 800° C. instead of 950° C., and the heat treatment for strengthening the bonding interface is carried out at 1000° C. instead of 1100° C. Despite the advantages, it may still be desirable to thermally anneal the substrate at about 1100° C. for 2 hours with the goal of, for example, producing an even better bonding quality than that already obtained, or because such an annealing step is a required client specification. The present method can accommodate such variants because the annealing step can be chosen to occur at any point of substrate fabrication, it being understood that the point will be selected appropriately by the skilled person. Further, such operation is possible for any heat treatment which could have been adapted and integrated into the series of "HR HT" heat treatments.

A further advantage of the first implementation described above is that the equipment is used efficiently. Thus, the same equipment used for heat treatments is also used to accomplish other goals. In addition, adjustments, in particular of wafers at the furnace inlets and outlets, are minimized. Due to these various improvements, time is saved and productivity is improved over the entirety of the fabrication process and, depending on the case, the amount of equipment necessary for processing can be reduced.

A further advantage of the invention described above is that oxide precipitates are "absorbed" or "diffused" into the adjacent oxide layer. Oxide precipitates in large quantities would otherwise tend to accumulate near the bonding interface if the precipitation heat treatments were carried out on a naked support, and would thus compromise the quality of the bonding. The adjacent oxide layer then constitutes a kind of buffer reservoir for undesirable precipitates, which are those located in the proximity of the bonding interface. Advantageously, in this case a substrate is obtained which has a certain mean density of oxide precipitates in the bulk of the support, and a lower density of oxide precipitates close to the oxide layer.

In a further variation, a detachment heat treatment is used that includes the first two stages of the heat treatment for precipitating oxygen. In this case, the third stage is advantageously combined with a heat treatment for strengthening the bonding interface and/or for oxidation in a sacrificial oxidation finishing step. This variation may be useful when detachment requires more thermal energy than in the first implementation.

Figure 3:
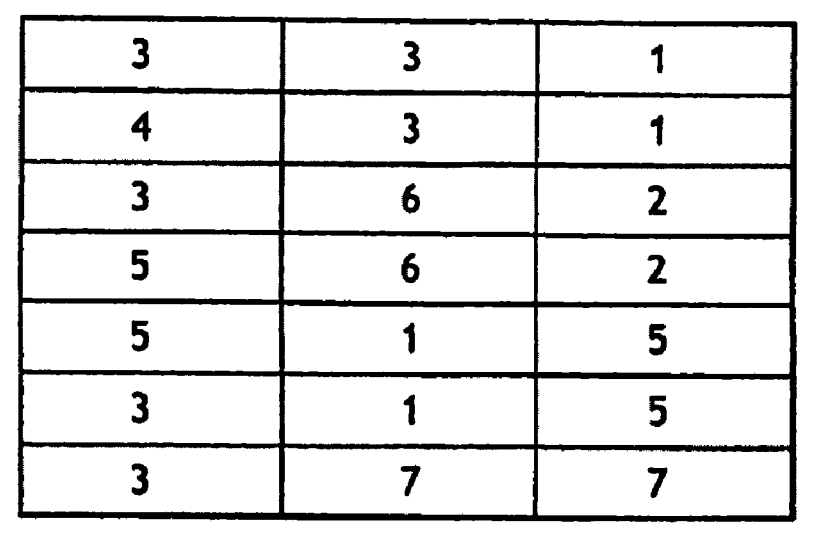

By way of non-limiting example, other possible implementations of the invention are shown in FIG. 3 which includes notations 1, 2, 3, 4, 5, 6, and 7 that correspond to treatments as follows. The notation 1 is a heat treatment for strengthening the bonding interface, which further includes thermal oxidation in an oxidation/deoxidation process. The notation 2 is a strengthening heat treatment of the bonding interface. The notation 3 is a detachment heat treatment. The notation 4 represents annealing the base substrate prior to bonding. The notation 5 is a complementary step. The notation 6 is thermal oxidation in a finishing step. Lastly, the notation 7 corresponds to a further treatment type. Each of these steps is a heat treatment step that may traditionally be used in a SMART-CUT® type method or other layer transfer method. The steps are used to control the precipitation of oxygen Oi from the base substrate or support layer 10 to endow the support layer with the desired resistance to the formation of slip lines during subsequent exposure to high temperatures.

It should be understood that the disclosed invention is not limited to the implementation described above and shown in the drawings. Other variations may be used, for example, one of the heat treatments for precipitating oxygen Oi in the support layer 10 may be a complementary step to the substrate fabrication method. The term "complementary step" used herein means an additional step to steps used during the fabrication process which nevertheless is associated with a treatment used during the fabrication process. For example, the first stage at about 650° C. acts as a portion of a heat treatment only for the purpose of precipitating oxygen Oi (it is thus a complementary step), and that the second stage, at about 800° C., simultaneously carries out another portion of the treatment for precipitating oxygen and a heat treatment for strengthening the bonding interface. In this case, the combination of the steps means that they are carried out with the same equipment (for example a furnace) and that advantageously, no supplemental manipulation is necessary (in the case of a furnace, the temperature is simply raised to carry out the treatments at 650° C. and 800° C. without any discontinuities).

In a further variation, the number of stages in the series of heat treatments for precipitating interstitial oxygen is modified, or the temperature levels and durations of the stages are adjusted. For example, compared with known methods, it is possible to reduce the durations of the stages. In this case, the desired resistance of the support layer 10 to the generation of slip lines can be obtained despite the non negligible subsistence of a large quantity of residual oxygen at the end of the series of heat treatments (i.e. even when the resistivity of the support has not been increased to form a genuine HR substrate). In this regard it is the quantity of oxygen precipitates which determines the resistance to the generation of slip lines, and not the quantity of residual oxygen that remains after carrying out the series of anti-slip line heat treatments. As a result, even if the reduction in the duration of the stages substantially reduces the precipitation phenomenon, the resistance to the formation of slip lines can still be satisfactory and time can be saved in the fabrication process. The invention therefore increases the flexibility for integrating precipitation heat treatments into a SMART-CUT® type layer transfer method.

It is also noted that, advantageously, it is easier to conduct finishing heat treatments involving high temperatures on a substrate which has undergone the described series of oxygen precipitation heat treatments to limit the generation of slip lines. In particular, rapid thermal annealing (RTA) type treatments can be easily conducted. Such RTA type heat treatments are used to improve the quality of the thin layer, in particular the surface roughness and the thickness uniformity of the thin layer.

What is claimed is:

1. A method for limiting slip lines in a semiconductor substrate comprising a support layer and a useful semiconductor layer that is transferred to the support layer, which comprises precipitating at least a portion of interstitial oxygen in the support layer by a series of heat treatments conducted after bonding of the useful semiconductor layer to the support layer at a temperature and a time sufficient to reduce the generation of slip lines therein, wherein the useful semiconductor layer is bonded to the support layer by molecular bonding.

2. The method of claim 1 wherein the semiconductor substrate is fabricated by implanting species through a surface of a source substrate to form a zone of weakness, bonding the surface of the source substrate to a support layer having an initial quantity of interstitial oxygen, detaching the useful layer from the source substrate along the zone of weakness to form the semiconductor substrate, and finishing the semiconductor substrate.

3. The method of claim 2 wherein at least one of the heat treatments occurs during detachment of the useful layer from a source substrate, or during a thermal oxidation or deoxidation step that occurs during a finishing step of the semiconductor substrate, or during a heat treatment to strengthen a bonding interface between the useful layer and the support layer.

4. The method of claim 1 wherein the initial concentration of interstitial oxygen in the support layer is in the range of about 12 to 14 new ppma.

5. The method of claim 1 wherein the useful semiconductor layer is is formed from monocrystalline silicon.

6. The method of claim 1 wherein the series of heat treatments for precipitating interstitial oxygen comprises at least two heat treatments at different temperatures.

7. The method of claim 6 further comprising a first heat treatment in a first temperature range and a second heat treatment in a second temperature range that is higher than the first range.

8. The method of claim 7 wherein the first heat treatment occurs during at least one of detachment of the useful layer, or during bonding of the source substrate to the support layer.

9. The method of claim 7 wherein the first heat treatment comprises a complementary step.

10. The method of claim 7 wherein the second heat treatment occurs during at least one of detachment of the useful layer, or during a thermal oxidation or deoxidation step during a finishing step of the semiconductor substrate, or during a heat treatment for strengthening the bonding interface.

11. The method of claim 10 wherein the heat treatment for strengthening the bonding interface further comprises a thermal oxidation process.

12. The method of claim 7 further comprising a third heat treatment in a third temperature range that is higher than the second temperature range.

13. The method of claim 12 wherein the third heat treatment is integrated into a heat treatment for strengthening the bonding interface.

14. The method of claim 13 wherein the heat treatment for strengthening the bonding interface further comprises a thermal oxidation process.

15. The method of claim 12 wherein the third heat treatment comprises a complementary step.

* * * * *